US012621545B2

(12) United States Patent
Kim

(10) Patent No.: US 12,621,545 B2
(45) Date of Patent: May 5, 2026

(54) OPTICAL ROIC INTEGRATION FOR OLED-BASED INFRARED SENSORS

(71) Applicant: THE BOARD OF REGENTS FOR THE OKLAHOMA AGRICULTURAL AND MECHANICAL COLLEGES, Stillwater, OK (US)

(72) Inventor: Do Young Kim, Tulsa, OK (US)

(73) Assignee: The Board of Regents for the Oklahoma Agricultural and Mechanical Colleges, Stillwater, OK (US)

( * ) Notice: Subject to any disclaimer, the term of this patent is extended or adjusted under 35 U.S.C. 154(b) by 32 days.

(21) Appl. No.: 18/545,218

(22) Filed: Dec. 19, 2023

(65) Prior Publication Data

US 2024/0137625 A1      Apr. 25, 2024

Related U.S. Application Data

(63) Continuation of application No. PCT/US2022/034324, filed on Jun. 21, 2022.
(Continued)

(51) Int. Cl.
H04N 23/21 (2023.01)
H10K 59/65 (2023.01)

(52) U.S. Cl.
CPC ............. H04N 23/21 (2023.01); H10K 59/65 (2023.02)

(58) Field of Classification Search
CPC .......... H04N 23/21; H04N 5/33; H10K 59/65; H10K 39/34; H10K 30/35; H10F 39/809
See application file for complete search history.

(56) References Cited

U.S. PATENT DOCUMENTS 5,311,033 A      5/1994  Disanayaka
2007/0029482 A1      2/2007  Laou et al.
(Continued)

FOREIGN PATENT DOCUMENTS

EP      2577747 B1      5/2011

OTHER PUBLICATIONS

Patent Cooperation Treaty, Notification of Transmittal of the International Search Report and the Written Opinion of the International Searching Authority, or the Declaration for PCT/US2022/034324 mailed Oct. 11, 2022.
(Continued)

*Primary Examiner* — Kathleen V Nguyen
(74) *Attorney, Agent, or Firm* — DUNLAP CODDING, P.C.

(57)      ABSTRACT

An image capture device is described. The image capture device includes a visible image sensor, an optical transfer medium, a non-pixelated non-visible sensitive light source, and a non-visible sensitizing part. The visible image sensor is configured to receive visible light indicative of a scene and generate an image depicting the scene. The optical transfer medium is on the visible image sensor. The optical transfer medium is constructed of a material operable to pass visible light indicative of the scene to the visible image sensor. The non-pixelated non-visible sensitive light source is connected to the optical transfer medium. The light source is configured to generate visible light indicative of the scene in response to non-visible medium stimulation. The non-visible sensitizing part is configured to detect the non-visible medium indicative of the scene.

20 Claims, 5 Drawing Sheets

Related U.S. Application Data

(60) Provisional application No. 63/213,023, filed on Jun. 21, 2021.

(56) References Cited

U.S. PATENT DOCUMENTS

| | | | |
|---|---|---|---|
| 2013/0215496 A1 | 8/2013 | Ban et al. | |
| 2014/0111652 A1* | 4/2014 | So | H10K 65/00 |
| | | | 348/164 |
| 2014/0175410 A1* | 6/2014 | So | H10K 65/00 |
| | | | 257/40 |
| 2015/0372046 A1 | 12/2015 | Kim | |
| 2019/0393271 A1* | 12/2019 | So | H10K 50/15 |

OTHER PUBLICATIONS

European Patent Office, Extended European Search Report, dated Apr. 3, 2025, regarding Application No. 22829143.1, 10 pages.

Kim, Do Young, et al., Multi-spectral imaging with infrared sensitive organic light emitting diode, Scientific Reports, Aug. 5, 2014, 5 pages.

The Board of Regents for Oklahoma Agricultural and Mechanical Colleges, Response to Apr. 3, 2025 Extended European Search Report regarding Application No. 22829143.1, dated Oct. 8, 2025.

* cited by examiner

OPTICAL ROIC INTEGRATION FOR OLED-BASED INFRARED SENSORS

REFERENCE TO RELATED APPLICATIONS

The present patent application is a continuation and claims priority to the patent application identified by International Application No. PCT/US22/34324, filed Jun. 21, 2022, which claims benefit under 35 USC § 119(e) of U.S. Provisional Application No. 63/213,023, filed Jun. 21, 2021. The entire contents of the both patent application(s) are hereby expressly incorporated herein by reference.

FEDERALLY SPONSORED RESEARCH AND DEVELOPMENT

Not applicable.

BACKGROUND ART

Current shortwave infrared (SWIR) image sensor technologies—defined as the wavelength range between 1.0 and 3.0 μm (from the cut-off of Si to that of the mid-wave infrared atmospheric window) are extremely expensive technology—and rely upon III-V materials (In, Ga, Sb, and As) that have the advantage of high absorption efficiency, high carrier drift velocity and mature design. However, SWIR-sensitive semiconductors of the SWIR image sensor technologies always require an expensive epitaxial growth process only suitable for small area applications; the epitaxial-grown SWIR photodetector pixel arrays must also be pixelized by a complicated expensive semiconductor photolithography process; and SWIR photodetector pixel arrays must also be connected to a silicone-based readout integrated circuits (ROIC) by problematic chip bonding processes for making infrared imaging. The current process of fabricating SWIR image sensor technologies results in a high cost of consumer products and makes it very challenging to make a fine pixel size. The final SWIR image sensors have a limited pixel resolution of below 1 million pixels. As such, applications of the traditional SWIR image sensors are severely limited.

Despite the limitations of the current SWIR image sensor technologies, SWIR image sensor technologies are currently utilized in cameras, scopes, night vision devices, lenses, displays, etc. 'To this end, there is a need for an improved SWIR image sensor, which can be flexible, realized at an ultralow-cost, have increased resolution, have smaller size, be lighter in weight, have a larger pixel resolution and format, and be operated at room-temperature. It is to such an improved image capture device that the present disclosure is directed.

DETAILED DESCRIPTION

Figures 1A, 1B:
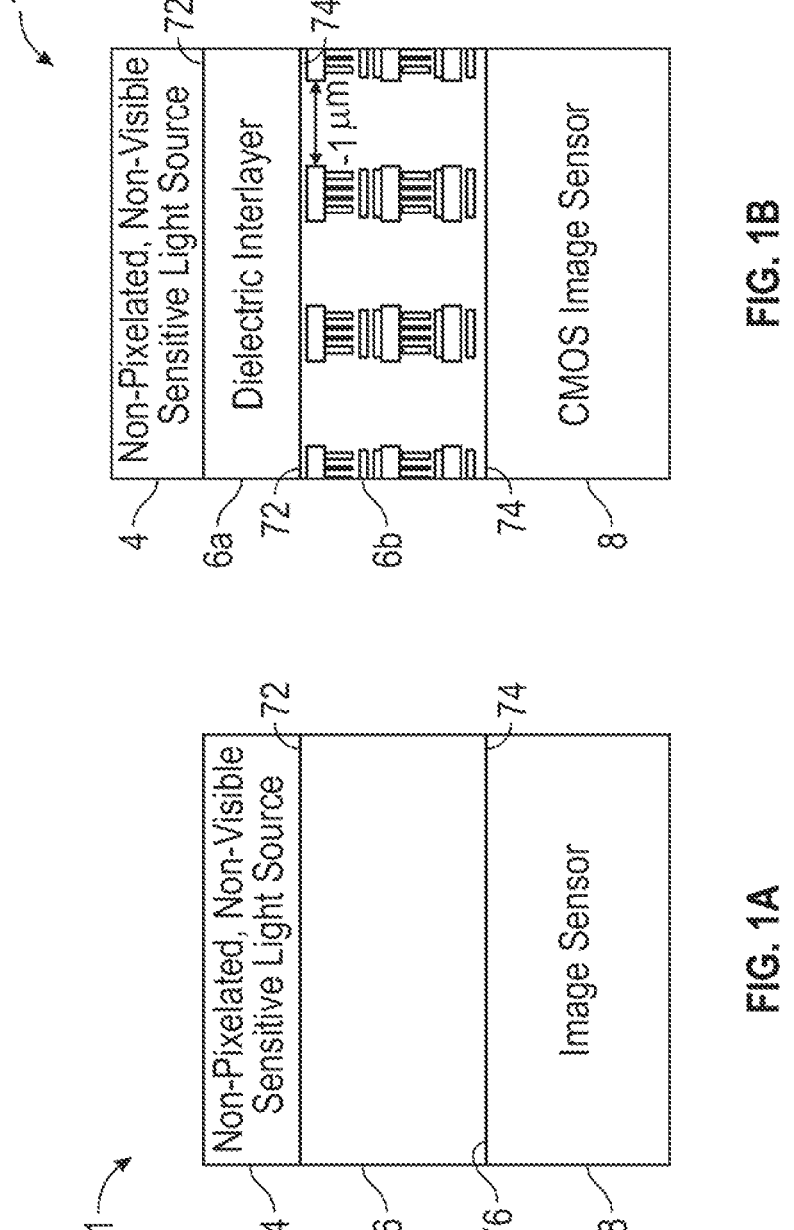
FIG. 1A is a schematic, cross-sectional view of an exemplary image capture device in accordance with the present disclosure.
FIG. 1B is a schematic, cross-sectional view of an exemplary image capture device in accordance with the present disclosure.

The following detailed description refers to the accompanying drawings. The same reference numbers in different drawings may identify the same or similar elements.

The mechanisms proposed in this disclosure circumvent the problems described above. The present disclosure describes an image capture device including a non-pixelated non-visible sensitive light source, an optical transfer medium, and a visible image sensor in accordance with the present disclosure.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the implementations herein. This is done merely for convenience and to give a general sense of the inventive concept. This description should be read to include one or more and the singular also includes the plural unless it is obvious that it is meant otherwise.

Further, use of the term "plurality" is meant to convey "more than one" unless expressly stated to the contrary.

As used herein, qualifiers like "substantially," "about," "approximately," and combinations and variations thereof, are intended to include not only the exact amount or value that they qualify, but also some slight deviations therefrom, which may be due to manufacturing tolerances, measurement error, wear and tear, stresses exerted on various parts, and combinations thereof, for example.

The use of the term "at least one" or "one or more" will be understood to include one as well as any quantity more than one. In addition, the use of the phrase "at least one of X, V, and Z" will be understood to include X alone, V alone, and Z alone, as well as any combination of X, V, and Z.

The use of ordinal number terminology (i.e., "first", "second", "third", "fourth", etc.) is solely for the purpose of differentiating between two or more items and, unless explicitly stated otherwise, is not meant to imply any sequence or order or importance to one item over another or any order of addition.

The term "image", as used herein, means two-dimensional or three-dimensional visual representation of something: such as (1): a likeness of an object produced on a photographic material (2): a picture produced on an electronic display (such as a television or computer screen); or (3) data that can be perceived either directly or with the aid of a machine or a device.

As used herein, all numerical values or ranges (e.g., in units of length such as micrometers or millimeters) include fractions of the values and integers within such ranges and fractions of the integers within such ranges unless the context clearly indicates otherwise. Thus, to illustrate, reference to a numerical range, such as 1-10 includes 1, 2, 3, 4, 5, 6, 7, 8, 9, 10, as well as 1.1, 1.2, 1.3, 1.4, 1.5, etc., and so forth. Reference to a range of 1-50 therefore includes 1, 2, 3, 4, 5, 6, 7, 8, 9, 10, 11, 12, 13, 14, 15, 16, 17, 18, 19, 20, etc., up to and including 50, as well as 1.1, 1.2, 1.3, 1.4, 1.5, etc., 2.1, 2.2, 2.3, 2.4, 2.5, etc., and so forth. Reference to a series of ranges includes ranges which combine the values of the boundaries of different ranges within the series. Thus, to illustrate reference to a series of ranges, for example, of 1-10, 10-20, 20-30, 30-40, 40-50, 50-60, 60-75, 75-100, 100-150, 150-200, 200-250, 250-300, 300-400, 400-500, 500-750, 750-1,000, includes ranges of 1-20, 10-50, 50-100, 100-500, and 500-1,000, for example.

Finally, as used herein any reference to "one implementation" or "an implementation" means that a particular element, feature, structure, or characteristic described in connection with the implementation is included in at least one implementation. The appearances of the phrase "in one implementation" in various places in the specification are not necessarily all referring to the same implementation.

In accordance with implementation of the present disclosure, the present disclosure describes an image capture device, that improves upon conventional infrared sensors by being more flexible, achieved at an ultralow-cost, higher resolution, compact, lighter in weight, include a larger format, and operated at room-temperature.

As discussed above, the majority of current shortwave infrared (SWIR) image sensor technologies are expensive and rely upon Ill-V materials (In, Ga, Sb, and As) that have the advantage of a high absorption efficiency, high carrier drift velocity and mature design. However, current SWIR image sensor technologies require an expensive epitaxial growth process only suitable for small area applications, complicated photolithography pixelization processes, and problematic chip bonding processes. The present disclosure addresses these deficiencies with a system and method for fabricating an image capture device provided with a visible image sensor, one or more optical transfer medium, and a non-pixelated non-visible sensitive light source that does not require the extremely expensive epitaxial growth process, the semiconductor photolithography process, or the direct electrical connection to a Si-based ROIC by a chip bonding process.

FIGS. 1A-1B illustrate a schematic, cross-sectional view of the image capture device 1 in accordance with the present disclosure. As illustrated in FIG. 1A, the Image capture device 1 has a non-pixelated non-visible sensitive light source 4, one or more optical transfer medium 6, and a visible image sensor 8. The one or more optical transfer medium 6 is in between the non-pixelated non-visible sensitive light source 4 and the visible image sensor 8. In one embodiment, the non-pixelated non-visible sensitive light source 4, the one or more optical transfer medium 6, and the visible image sensor 8 are bonded together to form a composite structure as the image capture device 1. In one implementation, the optical transfer medium 6 may be comprised of a first optical transfer medium 6a and a second optical transfer medium 6b, as seen in FIG. 1B. In one implementation, the first optical transfer medium 6a may be a dielectric interlayer. The dielectric interlayer 6a may have a thickness between about 1 nm to about 200 nm. In one implementation, the dielectric interlayer 6a may be positioned between the non-pixelated non-visible sensitive light source 4 and the second optical transparent medium 6b as seen in FIG. 1B. The image capture device 1 may be constructed of a flexible material so that the image capture device 1 may be malleable.

Figure 2:
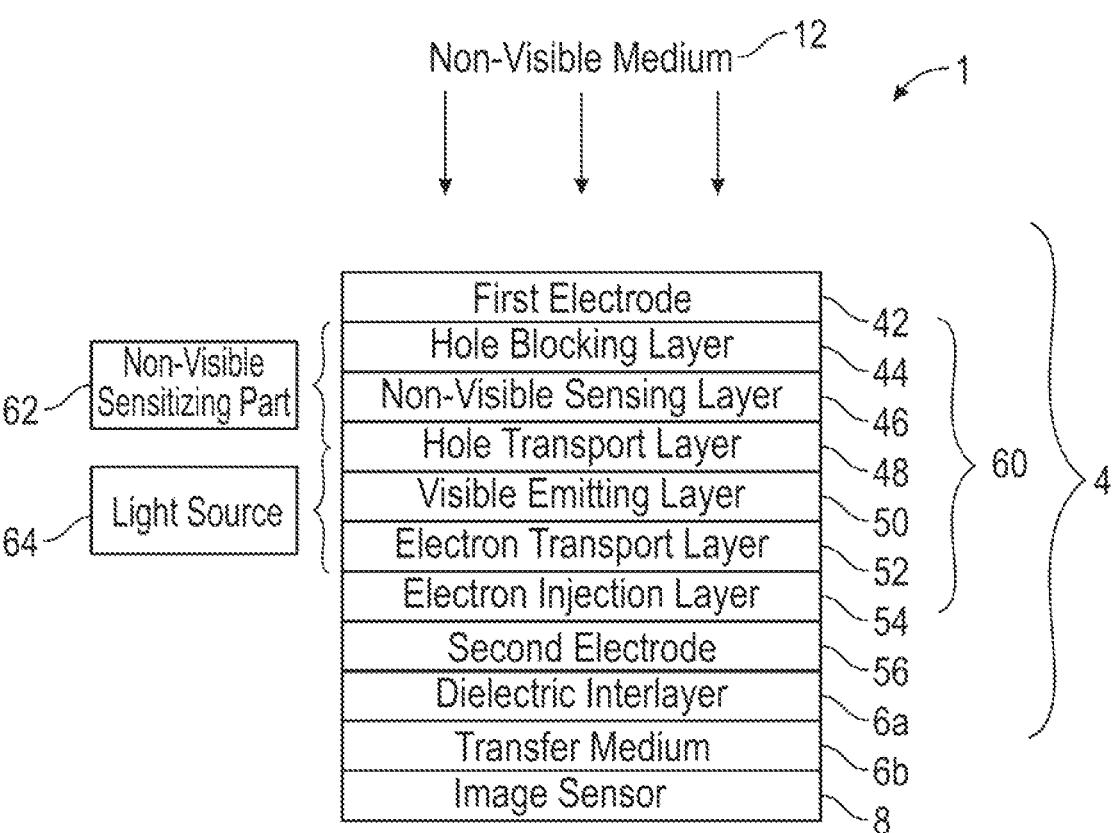
FIG. 2 is a schematic view of the image capture device of FIG. 1B having an exemplary non-pixelated non-visible sensitive light source coupled to a visible image sensor.

FIG. 2 illustrates an exemplary image capture device 1 receiving a non-visible medium 12 in accordance with the present disclosure. The non-visible medium 12 may be infrared light, ultraviolet light, and the like. In one embodiment, the non-visible medium 12 may be short-wave infrared light, mid-wave infrared light or long-wave infrared light. More specifically, FIG. 2 illustrates a cross-sectional diagram of the non-pixelated non-visible sensitive light source 4 in combination with the first optical transfer medium 6a, the second optical transfer medium 6b, and the visible image sensor 8. The non-pixelated non-visible sensitive light source 4 functions to convert the non-visible medium 12 to visible light. The non-pixelated non-visible sensitive light source 4 has a first electrode 42, a hole blocking layer 44, a non-visible sensing layer 46, a hole transport layer 48, a visible emitting layer 50, an electron transport layer 52, an electron injection layer 54, and a second electrode 56. A first electrode 42 positioned away from the first optical transfer medium 6a, a second electrode 56 positioned on the optical transfer medium 6a, and a plurality of semiconducting organic and/or inorganic thin film layers 60 positioned between the first electrode 42 and a second electrode 56. Some of the semiconducting organic and/or inorganic thin film layers 60 form the non-visible sensitizing part 62, and other ones of the semiconducting organic thin film layers 60 form the light source 64, which is described herein by way of example as an OLED.

The semiconducting organic and/or inorganic thin film layers 60 may include the electron injection layer 54, the electron transport layer 52, the visible emitting layer 50, the hole transport layer 48, the non-visible sensing layer 46, and the hole blocking layer 44. The semiconducting organic and/or inorganic thin film layers 60 of the image capture device 1 are positioned between the first electrode 42 and the second electrode 56. The first and second electrodes 42 and 56 are constructed of an electrically conductive material. The thickness of the one or more semiconducting organic and/or inorganic thin film layers 60 may be between 1-200 nm. The first electrode 42 may be used as an anode or a cathode and the second electrode 56 may be used as a cathode or an anode. In the example described herein, the first electrode 42 is an anode, and the second electrode 56 is a cathode. It should be understood, however, that when the first electrode 42 is a cathode and the second electrode 56 is an anode, the structure is changed to have the following sequence of layers cathode/electron injection layer/electron transport layer/visible emitting layer/hole transport layer/non-visible sensing layer/hole blocking layer/anode; or cathode/electron blocking layer/non-visible sensing layer/electron transport layer/visible emitting layer/hole transport layer/hole injection layer/anode. The anode is an electrode supplying a positively charged hole as a charge carrier. The cathode is an electrode supplying a negatively charged electron as a charge carrier. In one implementation, the first electrode 42 may be a transparent anode, and the second electrode 56 may be a transparent cathode. Also, the first electrode 42 may be a transparent top anode, and the second electrode 56 may be a transparent bottom cathode. The first electrode 42 may be transparent to visible light, and may also be transparent to the non-visible medium 12 used to stimulate the non-visible sensitizing part 62. The electron injection layer 54, the electron transport layer 52, the visible emitting layer 50, and the hole transport layer 48 form the light source 64. The non-visible sensitizing part 62 is formed by the hole transport layer 48, the non-visible sensing layer 46 and the hole blocking layer 44.

Figure 4A:
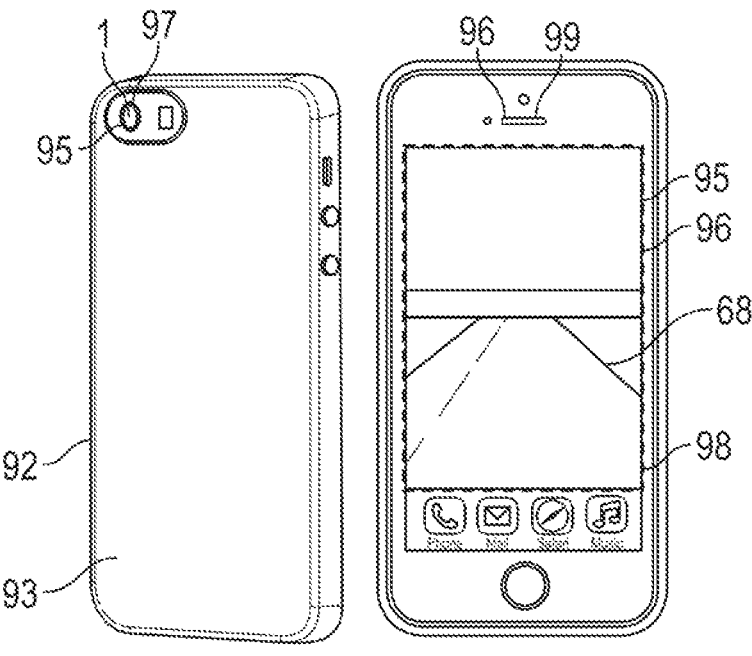
FIG. 4A is a combined front and rear view of a mobile device incorporating an image capture device in accordance with the present disclosure.
Figure 4B:
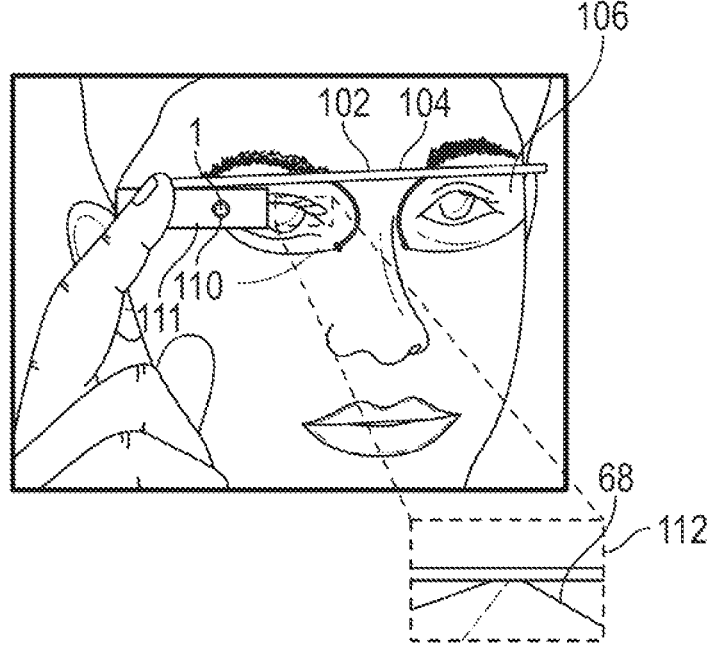
FIG. 4B is a front view of an exemplary pair of smart glasses having an image capture device in accordance with the present disclosure.

In use, the non-visible medium 12 may be directed through a free space (e.g., air) 1 to the image capture device 1, in particular to the first electrode 42 of the image capture device 1. The image capture device 1 receives the non-visible medium 12 and the image capture device 1 converts the non-visible medium 12 into a final image 68 (as seen in FIGS. 4A, 4B, and FIG. 5). More specifically, the non-pixelated non-visible sensitive light source 4 receives the non-visible medium 12 and converts the non-visible medium 12 into visible light. The visible light passes through the first optical transfer medium 6a, the second optical transfer medium 6b, and is received by the visible image sensor 8. The visible image sensor 8 converts the visible light into a final image.

To activate the non-pixelated non-visible sensitive light source 4, a voltage is placed across the first electrode 42 and the second electrode 56 by way of a power supply. The voltage should be at a level that is insufficient to cause the visible emitting layer 50 to emit light without the non-visible medium 12 being supplied to the non-visible sensitizing part 62. The voltage applies a forward bias to the light source 64, without independently causing the light source 64 to emit light. The voltage placed across the first electrode 42 and the second electrode 56 may be about 5V to about 15V. In some implementations, the power supply can be a battery, a solar cell, or a circuit that converts alternating current to direct current. For example, the circuit can be a switching power supply circuit.

The non-visible sensitizing part 62 is configured to detect a presence of the non-visible medium 12 (e.g., infrared light) containing original non-visible image information, and to activate the light source 64 to emit visible light containing the visible image information same as the original non-visible image information because the distance between the non-visible sensing layer 46 and the visible emitting layer 50 is significantly small (less than 50 nm). The image information indicates different intensities of non-visible medium and/or visible light at different planar locations on the image capture device 1, the non-pixelated non-visible sensitive light source 4, the non-visible sensitizing part 62, the light source or OLED 64, and/or the visible image sensor 8. As the emitted visible light containing the visible image information same as the original non-visible image information from the non-pixelated non-visible sensitive light source 4 is then distributed to the visible image sensor 8 passing through the second electrode 56 and optical transfer mediums 6a, 6b, each pixel of the visible image sensor 8 receives different amounts of the visible light containing the visible image information same as the original non-visible image information to make the final image 68 (see FIG. 4 and FIG. 5). Thus, the image capture device 1 will capture the non-visible medium images 12 as the visible images 68. The light sources in the non-pixelated non-visible sensitive light source 4 can be an OLED, a halide perovskite LED, quantum dot LED, etc.

To keep the light source 64 from emitting light, i.e., "off" under forward bias, the hole blocking layer (HBL) 44 located between the non-visible sensing layer 46 and the first electrode 42 blocks hole injection from the first electrode 42.

The non-visible medium 12, such as infrared light, is applied to the non-visible sensing layer 46 through the first electrode 42, and the hole blocking layer 44. The non-visible sensing layer 46 may have colloidal quantum dots (CQDs). For examples, CQDs are small organic, inorganic and/or hybrid semiconductor nanoparticles ranging in size from about 1 nm to about 30 nm. CQDs are used to generate photo-generated holes that are injected through the hole transport layer (HTL) 48 into the visible emitting layer 50 of the light source 64. Unlike epitaxial-grown infrared sensor technologies, epitaxial-free CQDs can be solution-processable due to organic ligands on the surface of the CQDs. CQDs also have strong infrared photosensitivity and great potential for low-cost infrared sensor applications because of CQDs inherent compatibility with low-cost, low-temperature environments, high-temperature environments, and large area processing methods. CQDs are widely used in optoelectronic applications, where CQDs size-tunable optoelectronic properties and suitability for printing or solution-based processing are distinctive characteristics and major assets of CQDs.

The photo-generated holes generated by the CQDs recombine with electrons injected through the electron injection layer 54 from the second electrode 56 and cause the visible emitting layer 50 to emit visible light. The second electrode 56 is constructed of a material that is transparent to visible light thereby directing the visible light generated by the visible emitting layer 50 towards the visible image sensor 8. The non-visible sensitizing part 62 prevents a sufficient amount of photo-generated holes supplied by the first electrode 42 from reaching the visible emitting layer 50 of the light source 64 to independently generate light, and supplies photo-generated holes to the visible emitting layer 50 via the hole transport layer 48 in the presence of the non-visible medium 12 thereby enabling the light source 64 to emit visible light. The non-pixelated non-visible sensitive light source 4 may have a thickness between about 1 nm and about 300 nm.

The one or more optical transfer medium 6 of the image capture device 1 has a top surface 72 and a bottom surface 74. The bottom surface 74 of the optical transfer medium 6 is positioned on a top surface 76 of the visible image sensor 8. The bottom surface 74 of the optical transfer medium 6 may be formed directly on the top surface 76 of the visible image sensor 8. In one implementation, the one or more optical transfer medium 6 includes a first optical transfer medium 6a and a second optical transfer medium 6b. The first optical transfer medium 6a may be the dielectric interlayer. The dielectric interlayer 6a is thinner, less than 200 nm, than a pixel size (several μm) of the visible image sensor 8. The thickness of the dielectric interlayer 6a allows visible images 68 to be captured by the visible image sensor 8 without an additional focus lens because of the thickness of the dielectric interlayer 6a positioned between the non-pixelated non-visible sensitive light source 4 and the visible image sensor 8. In one implementation, the dielectric interlayer 6a may be positioned between the light source 64 of the non-pixelated non-visible sensitive light source 4 and the second optical transfer medium 6b. In another implementation, the dielectric interlayer 6a is positioned between the light source 64 of the non-pixelated non-visible sensitive light source 4 and the visible image sensor 8. The second optical transfer medium 6b is constructed of a transparent material that is optically transparent to light in the visible spectrum, specifically light emission wavelengths of upper OLEDs. The optical transfer medium 6 may also be constructed of material that is optically transparent to light in the visible spectrum. As such, the optical transfer medium 6 is operable to pass visible light to the visible image sensor 8. Examples of the material used to construct the one or more optical transfer medium 6 includes, but is not limited to, $SiO_2$, $Si_3N_4$, $Al_2O_3$, SiNx, SiOxNy, polycarbonate, acrylic, polypropylene, polystyrene, etc. A fiber optics plate may also be used for the optical transfer medium 6.

Figure 3:
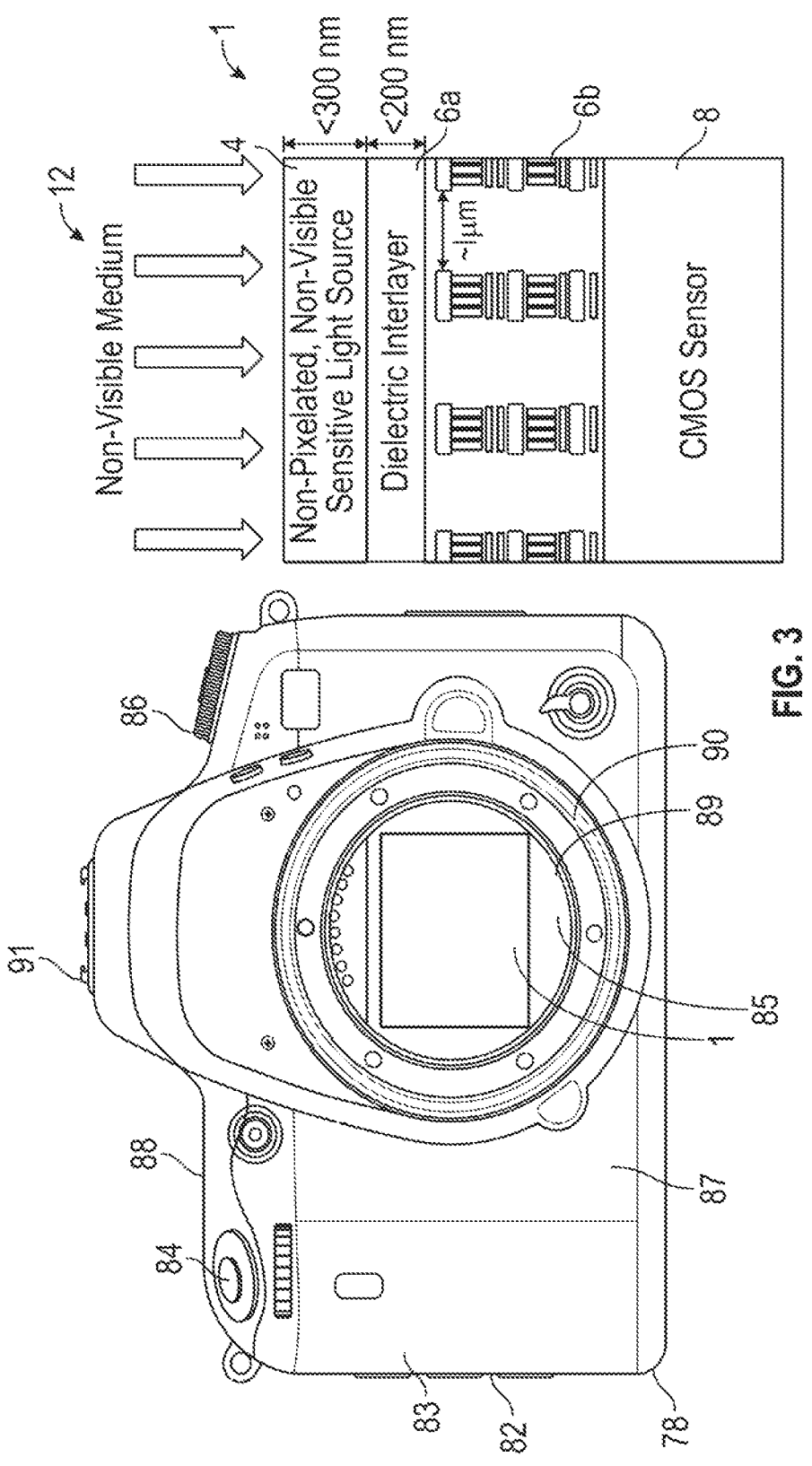
FIG. 3 is a front elevation view of an imaging camera having an image capture device in accordance with the present disclosure.

The visible image sensor 8 of the image capture device 1 captures the visible light that was converted from the non-visible medium 12 to form visible image 68 by the non-pixelated non-visible sensitive light source 4. The image capture device 1 may convert the non-visible medium 12 to the visible image 68 without pixelation in the device, as seen in FIG. 3. In one implementation, the image capture device 1 may receive infrared light and have an infrared sensitizing layer as the non-visible sensing layer 46. The image capture device 1 having the infrared sensitizing layer will only emit visible light under infrared illumination. The visible image sensor 8 may be any commercial-off-the-shelf (COTS) visible sensors such as a complementary metal oxide semiconductor (CMOS) image sensor that may have a significantly high resolution of over several hundred million pixels because of its small pixel pitch of less than 1 μm.

FIG. 3 illustrates a front elevational view of an imaging camera 78 incorporating the image capture device 1 in accordance with the present disclosure as an example. In one embodiment, the imaging camera 78 has a microcomputer (not shown), an eyepiece (not shown), a housing 82, a grip 83, a shutter button 84, a lens 85, a rotational dial 86, a lens mount 90, and the image capture device 1 receiving the non-visible medium 12 from the lens 85. The housing 82 has a front side 87 and a back side 88. The front side of the housing 82 has an opening 89, such that the opening 89 is positioned within the lens mount 90 on the front side 87 of the housing 82. The image capture device 1 is positioned within the opening 89 of the housing 82 of the imaging camera 78. The eyepiece may be held on the housing 82 in a fixed manner, or held thereon movably for the purpose of adjusting visibility by the user or the like.

In some implementations, the imaging camera 78 may have a strobe to flash non-visible lights such as an infrared light. The strobe flashes in accordance with an instruction of the microcomputer. The strobe may be contained in the housing 82, or may be attachable/detachable with respect to the housing 82. In the case of an attachable/detachable strobe, it is necessary to provide a strobe mount 91 on the housing 82 of the imaging camera 78.

The imaging camera 78 may be controlled by the microcomputer that controls the shutter button 84, the lens 85, the rotational dial 86, and the image capture device 1. The shutter button 84 receives an instruction from a user regarding the activation of an optional autofocus operation and a photometric operation, and also receives an instruction from the user regarding the start of capturing the image 68 by the image capture device 1. The shutter button 84 may receive a halfway depression from the user and an all the way depression in the direction of the housing 82 by the user. When the shutter button 84 is pressed halfway by the user in an autofocus mode, the microcomputer (not shown) instructs the lens 85 to perform the autofocus operation based on a signal from an autofocus sensor (not shown). In one implementation, the lens 85 may be altered by attaching alternate sizes of lenses to the front side 87 of the camera housing 82 via the lens mount 90. The lens mount 90 may be electrically connected to the alternate sizes of lenses using a connection terminal or the like, and also may be mechanically connected to the alternate sizes of lenses using a mechanical member such as an engagement member. The lens mount 90 may output a signal from the alternate size lenses to the microcomputer, and can output a signal from the microcomputer to the alternate size lenses. The lens mount 90 is configured so as to surround the opening 89 and the image capture device 1 such that the non-visible medium 12 passes through the lens mount 90 and the opening 89 to reach the image capture device 1. In one implementation, the non-visible medium 12 passes through the opening 89, not including the lens mount 90, to reach the image capture device 1. In other implementations, a plurality of control portions may control various parts of the imaging camera 78.

In one implementation, when the shutter button 84 is pressed all-the-way in the direction of the housing 82 by the user, the microcomputer (not shown) controls the image capture device 1 to capture the image 68 for a recording, i.e., a series of images 68. The shutter button 84 may contain two switches with one of the switches detecting a half-way press, and the other switch detecting an all-the-way press. In this way, the shutter button 84 may function by responding to the halfway depression and responding to an all-the-way depression.

FIG. 4A is a combined front and rear view of a mobile device 92 incorporating an image capture device 1 in accordance with the present disclosure as another example. The mobile device 92 has a housing 93, a display surface 94, a processor (not shown), memory (not shown), one or more input peripherals 95, one or more output peripherals 96, and an opening 97. The processor may comprise a microprocessor such as an Atom, A4 device, or the like. The processor's operation is controlled, in part, by information stored in the memory, such as an operating system software, application software ("apps"), data, or the like. The memory may comprise of a flash memory, a hard drive, or the like. The input peripherals 95 may include, but are not limited to, the image capture device 1, a microphone, a touch screen, and/or a keyboard. The one or more output peripherals 96 include may include the display surface 94 and/or a speaker 99. The image capture device 1 is positioned within the housing 93 to receive the non-visible medium 12 through the opening 97 of the mobile device 92.

In operation, the image capture device 1 of the mobile device 92 receives the non-visible medium 12 through the opening 97. The image capture device 1 converts the non-visible medium 12 into the image 68 (as described above). The image 68 is then displayed on the display surface 94 of the mobile device 92.

FIG. 4B is a front view of an exemplary pair of smart glasses 102 having an image capture device 1 in accordance with the present disclosure as another example. The smart glasses 102 have a frame 104, lenses 106, and the image capture device 1. The frame 104 of the smart glasses 102 has an opening 110. The image capture device 1 is positioned within the frame 104 of the smart glasses 102 such that the non-visible medium 12 is received by the image capture device 1 through the opening 110. In one implementation, the frame 104 of the smart glasses has a body 111. As seen in FIG. 4B, the body 111 may surround the opening 110 and support the image capture device 1 such that the image capture device 1 may receive the non-visible medium 12 passing through the opening 110. In another implementation, the frame 104 of the smart glasses 102 supports the image capture device 1 (not shown). In operation the image capture device 1 receives the non-visible medium 12 and converts the non-visible medium 12 into the image 68 (as described above). The image 68 is then displayed on a display surface 112 of the smart glasses 102.

Figures 5A, 5B:
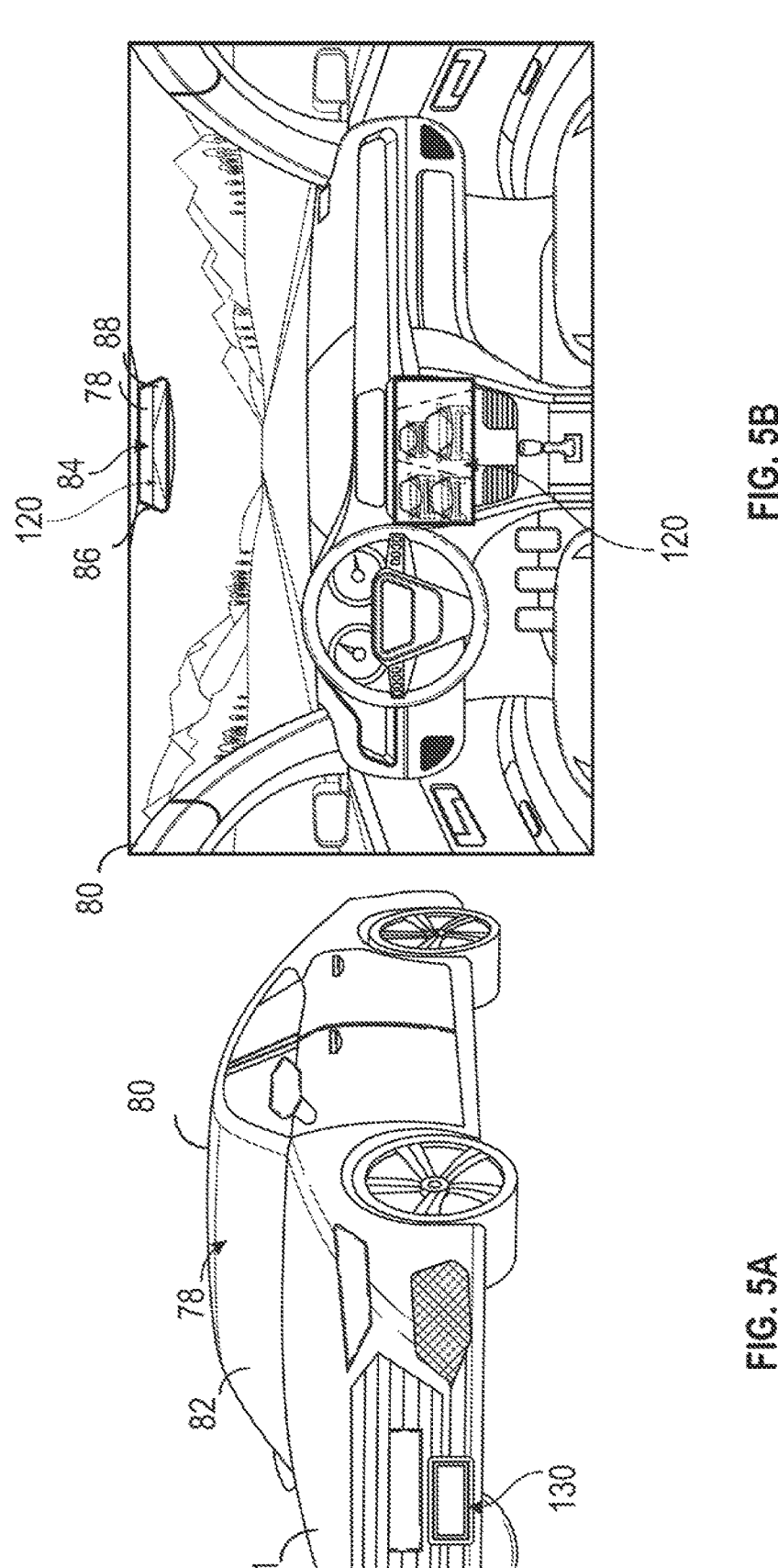
FIG. 5A an exterior perspective view of a vehicle having an image capture device in accordance with the present disclosure.
FIG. 5B is an interior elevation view of a vehicle having an image capture device in accordance with the present disclosure.

Referring now to FIGS. 5A and 5B, shown therein is an exterior perspective view (FIG. 5A) and an interior elevation view (FIG. 5B) of a vehicle 80, such as an automobile, having a night driving assistant camera system 78 incorporating an image capture device 1 in accordance with the present disclosure as another example. In some non-limiting embodiments, the vehicle 80 may be an aircraft, drone, or the like. The vehicle 80, has a frame (not shown), a source of motive force (e.g., engine or motor) supported by the frame for providing mechanical power to the vehicle 80, a propulsion system (e.g., transmission, operably connected to axles, wheels, and the like) receiving mechanical power provided by the source of motive force for propelling the vehicle, a body 81 supported by the frame providing coverage for the source of motive force and the propulsion system, having one or more window 82 supported by the body 81, and a rear view mirror assembly 84 supported by the one or more window 82 and/or frame. The mirror assembly 84 has a body 86, a front surface 88, and the night driving assistant camera system 78 incorporating the image capture device 1 positioned within the body 86 of the rear view mirror assembly 84. In some non-limiting embodiments, the rear-view mirror assembly 84 may be supported by the frame of the vehicle 80. In some embodiments, the night driving assistant camera system 78 incorporating the image capture device 1 is positioned within the body 86 of the rear-view mirror assembly 84 such that the non-visible medium 12 is received by the image capture device 1 of the night driving assistant camera system 78 through an opening (not shown) surrounded by the body 86. In another non-limiting embodiments, the night driving assistant camera system 78 incorporating the image capture device 1 is positioned within the body 86 of the rear-view mirror assembly 84 such that the non-visible medium is received by the image capture device 1 of the nigh driving assistant camera system 78 through the opening (not shown) surrounded by the front surface 88 of the rear-view mirror assembly 84.

In operation, the night driving assistant camera system 78 incorporating the image capture device 1 receives the non-visible medium 12 and converts the non-visible medium 12 into the image 68 (as described above). The image 68 is then displayed on a display surface 120 (e.g., LCD or LED screen) positioned within the vehicle 80 and in the driver's field of view.

Current night driving assist systems used in luxury cars are equipped with a conventional thermal imaging camera due to its relatively low prices even though the conventional thermal imaging camera has poor imaging quality. As described earlier, current epitaxial-grown SWIR imaging technologies are extremely expensive and thus have not been used as any commercial products like night driving assist camera system for the vehicle 80. The current thermal imaging-based night driving assist cameras have low sensitivity ($10^9$ Jones) and low-resolution images (1 million pixels). As a result, the current thermal imaging-based night driving assist cameras can provide only a short distance of visibility up to about 100 meters and their usage is also limited only for extremely dark conditions. Whereas, the infrared imaging camera 78 having the image capture device 1 may have a higher sensitivity (greater than $10^{11}$ Jones) and 100 times higher resolution images 120 (more than 100 million pixels). As a result, the night driving assist camera based on an infrared imaging camera 78 may provide greater than ten times the distance of visibility and may be operated at a variety of poor visibility conditions, unlike the conventional thermal imaging-based night driving assist cameras.

The poor visibility conditions include, but are not limited to, low-light, fog, smoke, rain during either daylight or night hours, and the like.

The image capture device 1 may also be used for Light Detection and Ranging (LiDAR) applications for drones, cars, airplanes, or the like (FIG. 5A). FIG. 5A is a schematic drawing of the vehicle 80, such as an automobile, having a LIDAR system 130 incorporating an image capture device 1 in accordance with the present disclosure as another example. The LIDAR system 130 incorporating the image capture device 1 is supported by the body 81. For example, a portion of the body 81 may be a bumper, and the LIDAR system 130 may be located adjacent to or on the bumper. In some non-limiting embodiments, the LIDAR system 130 may be supported by the frame of the vehicle 80. In operation, the LIDAR system 130 incorporating the image capture device 1 transmits the non-visible medium 12 away from the vehicle 80 and then receives reflections of the non-visible medium 12 and converts the reflections of the non-visible medium 12 into the image 68 (as described above). The image 68 is then displayed on a display surface 120 positioned within the vehicle 80 and in the driver's field of view.

Currently, Si-based visible and near-infrared (NIR) LiDAR is already commercialized, the visible/NIR LiDAR has to use a limited laser intensity following by Eye Safety (IEC 60825) due to strong eye sensitivity in the visible and NIR wavelengths, thus resulting in limited performance. However, the SWIR wavelength ranges are the eye-safe band and eye sensitivity is 100 times reduced in around 1.55 μm SWIR wavelengths. Therefore, a high-power laser may be used for SWIR LiDAR to improve range and reliability. As discussed, the innovative optical ROIC integration approach can realize high resolution of over 100 megapixels using the image capture device 1 at significantly lower prices. Therefore, the image capture device 1 may be suitable to SWIR LiDAR applications for drones, cars, and the like.

A method of forming the image capture device 1 of FIG. 1 includes positioning the non-pixelated non-visible sensitive light source 4 on the one or more optical transfer medium 6 and positioning the one or more optical transfer medium 6 on the visible image sensor 8. More specifically, the non-pixelated non-visible sensitive light source 4 may be fabricated by forming sequential semiconducting organic and/or inorganic thin film layers 60. For example, the second electrode 56 is directly deposited onto the first optical transfer medium 6a on the visible image sensor 8 using any suitable process. The one or more optical transfer medium 6 may be optically transparent to light in the visible spectrum. The one or more optical transfer medium 6 may be comprised of $SiO_2$, $Si_3N_4$, $Al_2O_3$, SiNx, SiOxNy, polycarbonate, acrylic, polypropylene, polystyrene, or other materials known to those of ordinary skill in the art. A fiber optics plate may also be used for the optical transfer medium 6.

The one or more optical transfer medium 6 may be deposited onto the visible image sensor 8. The one or more optical transfer medium 6 may be comprised of $SiO_2$, $Si_3N_4$, $Al_2O_3$, SiNx, SiOxNy, polycarbonate, acrylic, polypropylene, polystyrene or other materials known to those of ordinary skill in the art. A fiber optics plate may also be used for the optical transfer medium 6. The fiber optics plate as the optical transfer medium 6 may be bonded with the visible image sensor 8 by using any adhesive glues.

The second electrode 56 may be deposited onto the optical transfer medium 6. The second electrode 56 is transparent to the visible light. The second electrode 56 may be an ITO, an IZO, zinc-oxide, tin-oxide, a Carbon Nanotube, a silver nanowire, a poly(3,4-ethylenedioxythiophene) polystyrene sulfonate (PEDOT:PSS), Mg:Ag, or other material known to those of ordinary skill in the art configured to be electrically conductive, and transparent to the visible light.

In one implementation, the second electrode 56 is constructed of ITO having a thickness within a range of about 40-400 nm. In one implementation, the ITO is less than or equal to 100 nm thick. The resistivity of the ITO may be less than or equal to about $4 \times 10^{-4}$ $\Omega$cm.

The optical transfer medium 6, the second electrode 56, the semiconducting organic thin film layers 60, and the first electrode 42 may be deposited using a sputtering tool, such as a radio frequency magnetron sputtering tool and/or a chemical vapor deposition (CVD) tool such as a plasma enhanced chemical vapor deposition (PECVD) tool. All other layers except an ITO or an IZO bottom electrode are typically deposited by vacuum thermal evaporation process, or can also be deposited by solution-based processes such as a spin coating, an inkjet printing, a slot-die coating, and a spray coating.

Deposition parameters, such as temperature, pressure, process gas mixture, and deposition rate, are controlled such that the resistivity of the second electrode 56, for example, is achieved with a high carrier concentration. In one implementation, the second electrode 56 may be comprised of ITO. The charge carrier concentration of ITO as the second electrode 56 may be at least about $7 \times 10^{20}$ cm$^{-3}$. Preferably, the second electrode 56 has as high a charge carrier concentration as possible. The high carrier concentration enhances electron-injection, leading to an increase in electroluminescent efficiency. The second electrode 56 may be sputtered using an oxidized target. The oxidized target may be comprised of $In_2O_3$ and $SnO_2$, or other compositions known to those of skill in the art. In one implementation, the weight proportion of the $In_2O_3$ and $SnO_2$ is approximately 9:1. The deposition parameters of the sputtering process include a substrate temperature between 300-400° C., a processing pressure between $10^{-3}$-$10^{-5}$ Torr, a processing gas mixture of Ar and $H_2$, and a deposition rate of approximately 1-10 nm/min. In one implementation, the deposition rate may be 1-2 nm/min. In one implementation, the second electrode 56 has an optical transmittance in the visible wavelength range of over 85% and less than 100%. The work function of the second electrode 56 (e.g., the transparent cathode) should closely match the ionization potential of the subsequently formed organic functional layers. In one implementation, the second electrode 56 comprises a work function of about 4.45 eV.

The first electrode 42, the hole blocking layer 44, the non-visible sensing layer 46, the hole transport layer 48, the visible emitting layer 50, the electron transport layer 52, the electron injection layer 54, the second electrode 56 do not need to be pixelized.

The electron injection layer 54 is deposited onto and covers the second electrode 56. The electron injection layer 54 may be comprised of LiF, a Liq, or other materials known to those of ordinary skill in the art.

The electron transport layer 52 is deposited onto and covers the electron injection layer 50. The electron transport layer 52 may be comprised of BCP, a Bphen, a 3TPYMB, a TPBi, a TMPYPB, an Alq3, or other materials known to those of ordinary skill in the art.

The visible emitting layer 50 is deposited onto and covers the electron transport layer 52. The visible emitting layer 50 may be comprised of Ir(ppy)3, FlrPic, Ir(MDQ)2(acac) CBP, MEH-PPV, Alq3, or other materials known to those of ordinary skill in the art.

The hole transport layer 48 is deposited onto the visible emitting layer 50. The hole transport layer 48 may be comprised of a TAPC, a NPB, a TFB, a TPD, a poly-TPD, a TFB, a P3HT, or other materials known to those of ordinary skill in the art.

The non-visible sensing layer 46 is deposited onto and covers hole transport layer 48. The non-visible sensing layer 46 may be comprised of SnPc, a SnPc:C60, a SnNcCl2, a SnNcCl2, a CoiDFIC, PTB7-Th, a PTB7-Th:CoiDFIC, a PbS nanocrystal layer, a PbSe nanocrystal layer, and an InAs nanocrystal layer or other materials known to those of ordinary skill in the art.

The hole blocking layer 44 is deposited onto and covers the non-visible sensing layer 46. The hole blocking layer 44 may be comprised of a ZnO, a TiO, a BCP, a Bphen, a 3TPYMB, a TPBi, a TMPYPB, a PC60BM, a PC70BM, an ITIC, or other materials known to those of ordinary skill in the art.

The first electrode 42 is deposited onto and covers the hole blocking layer 44. The first electrode 42 is transparent to the non-visible medium 12. The first electrode 42 may be an ITO, IZO, zinc-oxide, tin-oxide, a Carbon Nanotube, a silver nanowire, a poly(3,4-ethylenedioxythiophene) polystyrene sulfonate (PEDOT:PSS), Mg:Ag, or other material known to those of ordinary skill in the art configured to be electrically conductive, and transparent to the non-visible medium 12 (e.g., short wave infrared, infrared, ultra-violet and the like).

The first electrode 42, the semiconducting organic and/or inorganic thin film layers 60, and the second electrode 56 may be deposited using a sputtering tool, such as a radio frequency magnetron sputtering tool. All other layers except an ITO or an IZO bottom electrode may also be deposited by vacuum thermal evaporation process, or can also be deposited by solution-based processes such as a spin coating, an inkjet printing, a slot-die coating, and a spray coating.

The first electrode 42 may be comprised of a Mg:Ag. The non-visible sensitizing part 62 includes the hole blocking layer 44, the non-visible sensing layer 46, and the hole transport layer 48. The hole blocking layer 44 may be comprised of BCP. The hole blocking layer 44 may have a thickness of 20 nm. The non-visible sensing layer 46 can be comprised of InAs colloidal nanocrystals to form an infrared sensor that converts infrared light into holes. The non-visible sensing layer 46 may have a thickness of 100 nm. The hole transport layer 48 is comprised of TAPC. The hole transport layer 48 may have a thickness of approximately 45 nm.

The non-pixelated non-visible sensitive light source 4 may be positioned on the top surface 72 of the one or more optical transfer medium 6. The top surface 72 of the one or more optical transfer medium 6 can be a depositing surface by which the non-pixelated non-visible sensitive light source 4 is deposited onto the depositing surface of the one or more optical transfer medium 6 by any suitable process including, but not limited to, a non-mechanical process. In one implementation, the first optical transfer medium 6a of the one or more optical transparent medium may be a dielectric interlayer. The first optical transfer medium 6a may be positioned on the depositing surface of the second optical transfer medium 6b, thus positioning the first optical transfer medium 6a between the second optical transfer medium 6b and the non-pixelated non-visible sensitive light source 4.

The one or more optical transfer medium 6 may be deposited onto and covers the top surface 76 of the visible image sensor 8. Examples of the material used to construct the one or more optical transfer medium 6 includes, but is not limited to, $SiO_2$, $Si_3N_4$, $Al_2O_3$, SiNx, SiOxNy, polycarbonate, acrylic, polypropylene, polystyrene, etc. The one or more optical transfer medium 6 may be deposited using a sputtering tool, such as a radio frequency magnetron sputtering tool and/or a CVD tool such as a PECVD tool. The one or more optical transfer medium 6 may also be typically deposited by vacuum thermal evaporation process, or can also be deposited by solution-based processes such as a spin coating, an inkjet printing, a slot-die coating, and a spray coating. A fiber optics plate may also be used for the optical transfer medium 6. The fiber optics plate as the optical transfer medium 6 may be bonded with the visible image sensor 8 by using any adhesive glues.

In some embodiments, the image capture device 1 has only a single light source 64, a single visible emitting layer 50, and a single non-visible sensing layer 46. In other embodiments, however, the light source 64, the visible emitting layer 50, and the non-visible sensing layer 46 can be pixelated.

While several implementations of the inventive concepts have been described for purposes of this disclosure, it will be understood that numerous changes may be made which will readily suggest themselves to those skilled in the art and which are accomplished within the spirit of the inventive concepts disclosed and as defined in the appended claims.

The following is a number list of non-limiting embodiments of the inventive concept disclosed herein:

1. An image capture device, comprising a visible image sensor configured to receive visible light indicative of a scene and generate an image depicting the scene; an optical transfer medium on the visible image sensor, the optical transfer medium constructed of a material operable to pass visible light indicative of the scene to the visible image sensor; and a non-pixelated non-visible sensitive light source connected to the optical transfer medium, and having a light source configured to generate visible light indicative of the scene in response to non-visible medium stimulation, a non-visible sensitizing part configured to detect the non-visible medium indicative of the scene, the non-pixelated non-visible sensitive light source positioned to pass visible light to the optical transfer medium such that visible light is passed to the image sensor.

2. The image capture device of illustrative embodiment 1, wherein the optical transfer medium comprises a dielectric interlayer comprised of one or more of a $SiO_2$, a $Si_3N_4$, an $Al_2O_3$, a SiNx, a SiOxNy, a polycarbonate, an acrylic, a polypropylene, a polystyrene, and a fiber optics plate.

3. The image capture device of illustrative embodiments 1 or 2, wherein the non-pixelated non-visible sensitive light source includes a transparent anode, the non-visible sensitizing part, the light source, and a transparent cathode, the non-visible sensitizing part being positioned between the transparent 4. The image capture device of illustrative embodiments 1-3, wherein the non-visible sensitizing part includes a hole blocking layer, a non-visible sensing layer, and a hole transport layer, the non-visible sensing layer being positioned between the hole blocking layer and the hole transport layer.

5. The image capture device of illustrative embodiments 1-4, wherein the light source includes the hole transport layer, a visible emitting layer, an electron transport layer, an electron injection layer, the visible emitting layer being positioned between the hole transport layer and the electron transport layer, the electron transport layer being positioned between the visible emitting layer and the electron injection layer.

6. The image capture device of illustrative embodiments 4-5, wherein the hole blocking layer is comprised of one or more of a ZnO, a TiO, a BCP, a 3TPYMB, a TPBi, a TMPYPB, a PC60BM, a PC70BM, and an ITIC.

7. The image capture device of illustrative embodiments 4-6, wherein the non-visible sensing layer is configured to sense infrared light, and wherein the non-visible sensing layer includes one or more of SnPc, a SnPc:C60, a SnNcCl2, a SnNcCl2, a CoiDFIC, PTB7-Th, a PTB7-Th:CoiDFIC, a PbS nanocrystal layer, a PbSe nanocrystal layer, and an InAs nanocrystal layer.

8. The image capture device according to illustrative embodiments 4-7, wherein the hole transporting layer is comprised of one or more of a TAPC, a NPB, a TFB, a TPD, a poly-TPD, a TFB, and a P3HT.

9. The image capture device of illustrative embodiments 5-8, wherein the visible emitting layer is configured to emit visible light, the visible emitting layer comprised of one or more of an Ir(ppy)3, a FlrPic, Ir(MDQ)2(acac), a MEH-PPV, and an Alq3.

10. The image capture device of illustrative embodiments 5-9, wherein the electron transport layer is comprised of one or more of a BCP, a Bphen, a 3TPYMB, a TPBi, a TMPYPB, and an Alq3.

11. The image capture device of illustrative embodiments 5-10, wherein the electron injection layer is comprised of one or more of a LiF and a Liq.

12. The image capture device of illustrative embodiments 1-11, wherein the non-visible sensitizing part and the light source positioned on the optical transfer medium.

13. The image capture device of illustrative embodiments 1-12, wherein the visible image sensor is comprised of one or more of a CMOS sensor, a CCD sensor, a TFT sensor.

14. The image capture device of illustrative embodiments 1-13, wherein the visible image sensor is flexible so as to be capable of being malleable without breaking.

15. A method, comprising receiving a non-visible medium of a scene through free space; converting the non-visible medium of the scene to visible light indicative of the scene; and capturing an image of the visible light indicative of the scene.

16. A method of making an image capture device, comprising connecting a visible image sensor, an optical transfer medium and a non-pixelated non-visible sensitive light source together to form a composite structure, with the optical transfer medium positioned between the visible image sensor and the non-pixelated non-visible sensitive light source.

What is claimed is:

1. An image capture device, comprising:
a visible image sensor configured to receive visible light indicative of a scene and generate an image depicting the scene;
an optical transfer medium on the visible image sensor, the optical transfer medium including a dielectric interlayer having a thickness in a range from about 1 nm to about 200 nm, the optical transfer medium constructed of a material operable to pass visible light indicative of the scene to the visible image sensor; and
a non-pixelated non-visible sensitive light source connected to the optical transfer medium, and having a light source configured to generate visible light indicative of the scene in response to non-visible medium stimulation, a non-visible sensitizing part configured to detect the non-visible medium indicative of the scene, the non-pixelated non-visible sensitive light source positioned to pass visible light to the optical transfer medium such that visible light is passed to the image sensor;

wherein the optical transfer medium is positioned between the visible image sensor and the non-pixelated non-visible sensitive light source.

2. The image capture device of claim 1, wherein the dielectric interlayer is comprised of one or more of a $SiO_2$, a $Si_3N_4$, an $Al_2O_3$, a SiNx, a SiOxNy, a polycarbonate, an acrylic, a polypropylene, a polystyrene, and a fiber optics plate.

3. The image capture device of claim 1, wherein the non-pixelated non-visible sensitive light source includes a transparent anode, the non-visible sensitizing part, the light source, and a transparent cathode, the non-visible sensitizing part being positioned between the transparent anode and the light source, the light source being positioned between the non-visible sensitizing part and the transparent cathode.

4. The image capture device of claim 1, wherein the non-visible sensitizing part includes a hole blocking layer, a non-visible sensing layer, and a hole transport layer, the non-visible sensing layer being positioned between the hole blocking layer and the hole transport layer.

5. The image capture device of claim 1, wherein the light source includes the hole transport layer, a visible emitting layer, an electron transport layer, an electron injection layer, the visible emitting layer being positioned between the hole transport layer and the electron transport layer, the electron transport layer being positioned between the visible emitting layer and the electron injection layer.

6. The image capture device of claim 4, wherein the hole blocking layer is comprised of one or more of a ZnO, a TiO, a BCP, a 3TPYMB, a TPBi, a TMPYPB, a PC60BM, a PC70BM, and an ITIC.

7. The image capture device of claim 4, wherein the non-visible sensing layer is configured to sense infrared light, and wherein the non-visible sensing layer includes one or more of SnPc, a SnPc:C60, a SnNcCl2, a SnNcCl2, a CoiDFIC, PTB7-Th, a PTB7-Th:CoiDFIC, a PbS nanocrystal layer, a PbSe nanocrystal layer, and an InAs nanocrystal layer.

8. The image capture device according to claim 4, wherein the hole transport layer is comprised of one or more of a TAPC, a NPB, a TFB, a TPD, a poly-TPD, a TFB, and a P3HT.

9. The image capture device of claim 5, wherein the visible emitting layer is configured to emit visible light, the visible emitting layer comprised of one or more of an Ir(ppy)3, a FlrPic, Ir(MDQ)2(acac), a MEH-PPV, and an Alq3.

10. The image capture device of claim 5, wherein the electron transport layer is comprised of one or more of a BCP, a Bphen, a 3TPYMB, a TPBi, a TMPYPB, and an Alq3.

11. The image capture device of claim 5, wherein the electron injection layer is comprised of one or more of a LiF and a Liq.

12. The image capture device of claim 1, wherein the non-visible sensitizing part and the light source are positioned on the optical transfer medium.

13. The image capture device of claim 1, wherein the visible image sensor is comprised of one or more of a CMOS sensor, a CCD sensor, a TFT sensor.

14. The image capture device of claim 1, wherein the visible image sensor is flexible so as to be capable of being malleable without breaking.

15. The image capture device of claim 1, wherein the visible image sensor includes pixels having a pixel size, and wherein the dielectric interlayer is thinner than the pixel size of the visible image sensor.

16. The image capture device of claim 1, wherein the optical transfer medium includes a first optical transfer medium and a second optical transfer medium.

17. The image capture device of claim 16, wherein the first optical transfer medium is the dielectric interlayer having the thickness configured to allow visible images to be captured by the visible image sensor without an additional focus lens.

18. The image capture device of claim 16, wherein the dielectric interlayer is positioned between the light source of the non-pixelated non-visible sensitive light source and the second optical transfer medium.

19. A method, comprising:

receiving a non-visible medium of a scene through free space;

converting the non-visible medium of the scene to visible light indicative of the scene;

passing the visible light through a dielectric interlayer having a thickness between about 1 nm to about 200 nm; and capturing an image of the visible light indicative of the scene.

20. A method of making an image capture device, comprising:

connecting a visible image sensor, an optical transfer medium and a non-pixelated non-visible sensitive light source together to form a composite structure, with the optical transfer medium including a dielectric interlayer having a thickness between about 1 nm to about 200 nm and positioned between the visible image sensor and the non-pixelated non-visible sensitive light source.

* * * * *